United States Patent [19]

Westmoreland

[11] Patent Number: 5,384,289

[45] Date of Patent: Jan. 24, 1995

[54] REDUCTIVE ELIMINATION CHEMICAL VAPOR DEPOSITION PROCESSES UTILIZING ORGANOMETALLIC PRECURSOR COMPOUNDS IN SEMICONDUCTOR WAFER PROCESSING

[75] Inventor: Donald L. Westmoreland, Boise, Id.

[73] Assignee: Micron Semiconductor, Inc., Boise, Id.

[21] Appl. No.: 78,617

[22] Filed: Jun. 17, 1993

[51] Int. Cl.⁶ .................. H01L 21/283; C23C 16/46
[52] U.S. Cl. ................. 437/245; 437/187; 437/192; 437/196
[58] Field of Search ............ 437/245, 246, 200, 196, 437/187, 192; 148/DIG. 147; 427/255.2

[56] References Cited

U.S. PATENT DOCUMENTS

| | | | |
|---|---|---|---|
| 5,005,519 | 4/1991 | Egermeier et al. | 118/722 |
| 5,089,438 | 2/1992 | Katz | 437/184 |
| 5,139,825 | 8/1992 | Gordon et al. | 427/255.2 |
| 5,178,911 | 1/1993 | Gordon et al. | 427/255.2 |
| 5,192,589 | 3/1993 | Sandhu | 427/255.1 |
| 5,205,870 | 4/1993 | Sato et al. | 118/722 |
| 5,252,518 | 10/1993 | Sandhu et al. | 437/200 |
| 5,254,499 | 10/1993 | Sandhu et al. | 437/192 |
| 5,278,100 | 1/1994 | Doan et al. | 437/200 |

OTHER PUBLICATIONS

Manasevit, H. M., "Recollections and Reflections of MOCVD", J. Crystal Growth 55 (1981) 1–9.

Bochkarev V.N., et al., "Silicon–Containing Heterocyclic Compounds XIV. Mass-Spectrometric Study of Some Silacyclopent 3-ene Derivatives", (1973) pp. 784–786.

Gilman, H. et al., "The Preparation and Reactions of Some 7-Silanorbornadienes. I. An Approach to Dimethylsilylene; Reactions of /-Silanorbornadienes", vol. 86, pp.1596–1599 (1963).

Chen, C. et al., "Difluorosilylene as a Precursor for the Chemical Vapor Deposition of Titanium Silicide", J. Mater. Chem., pp. 983–984 (1992).

Chao, T., et al., "Preparation of Some Cyclic Fluorosilanes", J. of Organometallic Chemistry 33 (1971) pp. 157–160.

Breil, H. et al., "Ki(cyclooctatetraene)titanium and Tri(cycloocctatetraene)dititanium; Angew. Chem Internat.", vol. 5 (1966) No. 10, pp. 898–899.

Terunma, Daiyo et al., "A One-Step Synthesis of 2,7-Dimethyl-5-silaspiro[4.4]nona-2,7-diene and the Synthesis of Its Derivatives", Bulletin of the Chemical Society of Japan, vol. 50 (6), 1545–1548 (1977).

Primary Examiner—Olik Chaudhuri
Assistant Examiner—Ken Horton
Attorney, Agent, or Firm—Wells, St. John, Roberts, Gregory & Matkin

[57] ABSTRACT

A method of chemical vapor depositing a layer on a semiconductor wafer includes: a) positioning a semiconductor wafer within a chemical vapor deposition reactor; b) providing an organometallic reductive elimination precursor source in a non-gaseous form, the non-gaseous organometallic precursor compound containing at least two ligands bonded to a linking atom; c) subjecting the non-gaseous organometallic reductive elimination precursor to temperature and pressure conditions which vaporize the non-gaseous organometallic reductive elimination precursor into a source gas, and providing the source gas into the chemical vapor deposition reactor having the semiconductor wafer positioned therein; d) subjecting the source gas to reactive conditions within the reactor effective to impart a reductive elimination reaction of the precursor which reduces the linking atom from the precursor and which oxidizes the ligands to generate gaseous molecules having all atoms in a closed shell, non-ionic configuration, with the gaseous molecules being expelled from the reactor; and e) depositing a layer on the wafer, the layer comprising the reduced linking atom.

33 Claims, No Drawings

REDUCTIVE ELIMINATION CHEMICAL VAPOR DEPOSITION PROCESSES UTILIZING ORGANOMETALLIC PRECURSOR COMPOUNDS IN SEMICONDUCTOR WAFER PROCESSING

TECHNICAL FIELD

This invention relates to chemical vapor deposition processes utilizing organometallic precursors.

BACKGROUND OF THE INVENTION

Chemical vapor deposition is but one process of providing thin films on semiconductor wafers. It is a favored deposition process in many respects, principally because of its ability to provide highly conformal layers even within deep contacts and other openings. By way of example only, one example prior art chemical vapor deposition technique for depositing TiN is by a low pressure deposition at a pressure of less than 1 Torr. Specifically, an example is the reaction of a titanium organometallic precursor of the formula $Ti(N(CH_3)_2)_4$, named tetrakisdimethylamidotitanium (TMAT) and ammonia in the presence of a carrier gas react according to the following formula:

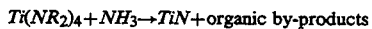

$Ti(NR_2)_4 + NH_3 \rightarrow TiN +$ organic by-products

Organometallic compounds contain a central or linking atom or ion (Ti in TMAT) combined by coordinate bonds with a definite number of surrounding ligands, groups or molecules, with at least one of which is organic (the $(N(CH_3)_2$ groups in TMAT). The central or linking atom as accepted within the art may not be a "metal" in the literal sense. As accepted within the art of organometallic compounds, the linking atom could be anything other than halogens, the noble gases, H, C, N, O, P, S, Se, and Te.

By way of example only, silicon would be one such atom which is not a "metal" in the literal sense, yet which can constitute the linking "metal" of an organometallic compound. It would be desirable to develop processes which utilize silicon organometallic precursors as sources for silicon in producing or providing layers of elemental silicon or silicon-containing compounds on semiconductor wafers. For example, silane $(SiH_4)$ is the principal source gas today utilized in semiconductor wafer processing for depositing silicon layers. Silane is an extremely unsafe gas, being very toxic and subject to spontaneous combustion when exposed to air. Accordingly, it would be desirable to develop other silicon sources for depositing silicon-containing layers on a semiconductor wafer.

It would also be desirable to develop alternate source of elements from organometallic precursors for chemical vapor deposition processes in semiconductor wafer processing.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of chemical vapor depositing a layer on a semiconductor wafer comprises:

positioning a semiconductor wafer within a chemical vapor deposition reactor;

providing an organometallic reductive elimination precursor source in a non-gaseous form, the non-gaseous organometallic precursor compound containing at least two ligands bonded to a linking atom;

subjecting the non-gaseous organometallic reductive elimination precursor to temperature and pressure conditions which vaporize the non-gaseous organometallic reductive elimination precursor into a source gas, and providing the source gas into the chemical vapor deposition reactor having the semiconductor wafer positioned therein;

subjecting the source gas to reactive conditions within the reactor effective to impart a reductive elimination reaction of the precursor which reduces the linking atom from the precursor and which oxidizes the ligands to generate gaseous molecules having all atoms in a closed shell, non-ionic configuration, with the gaseous molecules being expelled from the reactor; and depositing a layer on the wafer, the layer comprising the reduced linking atom.

Preferably, the deposited layer will predominantly be composed of the linking atom in elemental form, an alloy of the linking atom, or a compound containing the linking atom, or some mixture of these. By way of example only, two such linking atoms would include titanium and silicon. Typically and as is expected to be preferred, the number of ligands in the organometallic reductive elimination precursor will consist of two, with the two ligands preferably being identical to one another.

Reactive conditions within the reactor effective to impart a reductive elimination reaction are expected to include exposure to a temperature of at least 225° C. and a pressure of less than or equal to about 30 Torr. Preferred are temperatures of 750° C. or less, and pressures of 1 Torr or less. The organometallic reductive elimination precursors, while typically stable solids or liquids at room temperature, will spontaneously undergo a reductive elimination process and thereby decompose into dissociated ligands and the elemental linking atom under these temperature and pressure conditions. Such occurs by the association of each shared electron pair, which goes to make up the covalent bond between the linking atom and the ligand, with the linking atom. Such results in reduction of the linking atom and oxidation of the ligand.

In accordance with an aspect of the invention, the non-gaseous precursor compound is sublimed in a separate vessel, with the resulting gas fed to a chemical vapor deposition reactor. The precursor could be initially provided in a liquid phase, and then vaporized, or alternately liquified from a solid form and subsequently vaporized. Further alternately by way of example only, a solid chunk of the compound could be placed within the chemical vapor deposition reactor and appropriate temperature and pressure conditions provided to ultimately vaporize the precursor compound.

In one aspect of the invention, preferably at least one of the ligands bonded to the linking atom is a chelating ligand that forms a ring containing three or five ring atoms which includes the organometallic linking atom, with the chelating ligand containing a double bond in a position opposite the linking atom. Such a precursor is likewise a solid at room temperature and pressure conditions, and will spontaneously decompose under suitable elevated temperature and reduced pressure.

Alternate conditions within the reactor effective to impart a reductive elimination reaction include the provision of a non-thermal energy source in addition to or in substitution of a thermal energy source within the reactor. Such is believed to reduce the temperature required for the spontaneous reaction of compounds in accordance with the invention to about 150° C. Example additional or alternate energy sources in accordance with this aspect of the invention would include high intensity light such as ultraviolet radiation, radio frequency (RF) power (plasma), etc. This enhancement aspect of the invention is also usable in accordance with the processes which are described below.

Equations 1-3 below illustrate example reactions and depositions in accordance with the invention where the central atom (Ti or Si) is linked with two ligands which are identical. "R" and "R'" are organic groups or hydrogen. Other hydrogen atoms in the precursor are not shown for sake of clarity in these and other equations which follow, but would be present as any person of reasonable skill in the art would be aware.

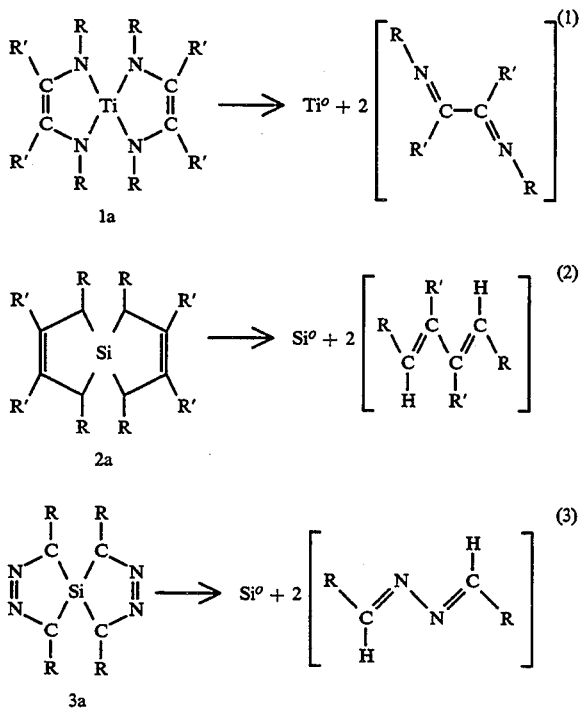

By the above processes, elemental titanium or silicon is deposited atop the wafer. The illustrated ligands which are oxidized from the precursor compound result in gaseous molecules having all atoms in a closed shell, non-ionic configuration, which are subsequently expelled from the reactor.

Equation 4 below illustrates an alternate process employing silacyclopent-3-ene wherein one ligand comprises butene in the non-oxidized compound form with Si, and two other ligands in the form of hydrogen atoms.

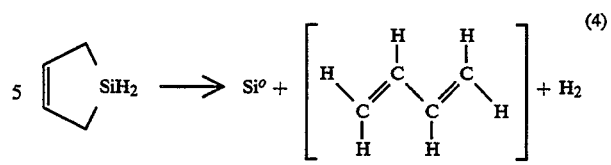

In a similar manner, 1,1-difluorosilacyclopent-3-ene can be used to generate difluorosilylene, which is a known useful material for formation of metal silicides.

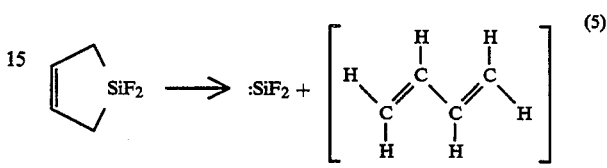

By each of the above examples, at least one ligand of the organometallic precursor compound forms a ring containing five ring atoms which includes the organometallic linking atom, with the chelating ligand containing a double bond in a position opposite the linking atom. Equation 6 below illustrates the same general construction, and also employs a ligand that forms a ring containing three ring atoms which includes the organometallic linking atom, with the particular chelating ligand containing a double bond in a position opposite the linking atom.

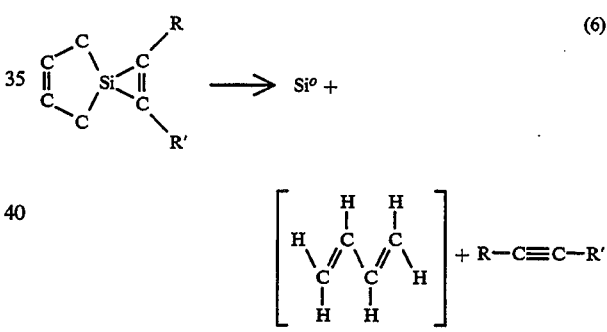

In accordance with another aspect of the invention, the invention further contemplates providing a reactive gas into the reactor with the source gas, with the reactive gas reacting with the linking atom upon its dissociation to form a linking atom compound incorporating at least one element of the reactive gas. The linking atom compound is deposited on the wafer, preferably with the deposited layer predominantly comprising the linking atom compound. By way of example only, a silane could be injected into the deposition reactor with an organometallic titanium precursor in accordance with the invention, thus providing a Si atom source with the Ti atom source of the precursor. The dissociated titanium would react with the silicon to deposit $TiSi_x$, typically predominately $TiSi_2$, on the wafer. As a further example, $NH_3$ could be substituted for the above silane, thus providing a nitrogen atom source. The deposited layer would predominately then be TiN. An added or substitute energy source could also of course be utilized, as described above.

In accordance with still another aspect of the invention, an alloy is formed. Formation of an alloy can be accomplished by way of co-depositing a metal from a second source in addition to the deposition of Ti, for example, from compound 1a. For example, a titanium source consisting of 1a would be placed in a separate chamber (C1) and attached to a deposition chamber, In addition, and aluminum source such as trimethylamine alane is placed in a second chamber (C2) also attached to the deposition chamber. The reactor is evacuated and brought to a process (wafer surface) temperature of 350°–450° C. and process pressure of 500 mTorr. The C1 and C2 chambers are evacuated to the same 500 mTorr pressure and heated to 200° C. for C1 and 30°–65° C. for C2, causing the materials to sublime into the deposition chamber. The gaseous precursors react at the heated wafer surface and decompose depositing elemental titanium and aluminum. In the process, gaseous N,N'-dimethyl-1,4-diaza-1,3-butadiene and trimethylamine and hydrogen are formed and expelled from the deposition reactor.

In accordance with yet another aspect of the invention, at least one of the ligands of the organometallic precursor compound includes cyclooctatetraene, or a derivative thereof. Equation 7 below is exemplary of the reduction elimination reaction which occurs.

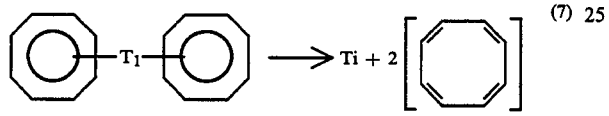 (7)

Such cyclooctatetraene organometallic precursor compounds would be manufacturable by people of skill in the art, such as shown by way of example as shown in "Preliminary Communication-Die elektrochemische Synthese von Titan-cyclooctatetraen-Komplexen", *Journal of Organometallic Chemistry*, H. Lehmkuhl, et al., 25 (1970), C44–C46 and "Di(cyclooctatetraene)-titanium and Tri(cyclooctatetraene)dititanium", *Angew. Chem. Internat. Edit.*, H. Briel, et al., Vol. 5, No. 10 (1966), which are hereby incorporated by reference.

Preparation of various other organometallic precursor compounds in accordance with the invention are known or readily determinable by people of skill in the art. Examples are shown in "A One-Step Synthesis of 2,7-Dimethyl-5-silaspiro[4.4]nona-2,7-diene and the Synthesis of Its Derivatives", *Journal of Organometallic Chemistry*, D. Terunuma, et al., Vol. 50 (6), pp. 1545–1548 (1977); and "The Preparation and Reactions of Some 7-Silanorbornadienes. I. An Approach to Dimethylsilylene", *Contribution From The Chemistry Department, Iowa State University, Ames, Iowa*, H. Gilman, et al., Vol. 86, pp. 1596–1599 (1963), which are hereby incorporated by reference.

Organometallic precursors as described above which utilize Si as the linking atom can serve as alternate silicon sources to silane.

EXAMPLE 1

A wafer is placed within a chemical vapor deposition reactor. Solid compound 1a from equation 1, bis[ethene 1,2(N,N'-dimethyl)diamide]titanium(IV), is placed within a separate chamber adjacent to reactor. The reactor is evacuated and brought to a process temperature of 350°–450° C. and a process pressure of 1 Torr. The chamber holding the solid 1a compound is evacuated to the same 1 Torr pressure as the reactor, and heated to a temperature of 350°–450° C., causing the 1a compound to sublime. The gas product is fed through a tube to the deposition reactor. Within the reactor, the gaseous 1a compound decomposes, depositing elemental titanium atop the surface of the semiconductor wafer. Gaseous N,N'-dimethyl-1,4diaza -1,3-butadiene is also formed, having all atoms in a closed shell, non-ionic configuration, and is substantially expelled from the deposition reactor.

EXAMPLE 2

A wafer is placed within a chemical vapor deposition reactor. Solid compound 2a from equation 2,5-silaspiro[4,4]nona-2,7diene, is placed within a separate chamber adjacent to reactor. The reactor is evacuated and brought to a process temperature of 350° C. and process pressure of 1 Torr. The chamber holding the solid 2a compound is evacuated to the same 1 Torr pressure as the reactor, and heated to a temperature of 300° C., causing the 2a compound to sublime. The gas product is fed through a tube to the deposition reactor. Within the reactor, the gaseous 2a compound decomposes, depositing elemental silicon atop the surface of the semiconductor wafer. Gaseous 1,3-butadiene is also formed, having all atoms in a closed shell, non-ionic configuration, and is substantially expelled from the deposition reactor.

EXAMPLE 3

A wafer is placed within a chemical vapor deposition reactor. Solid dicyclooctatetraenetitanium is placed within a separate chamber adjacent to reactor. The reactor is evacuated and brought to a process temperature of 300° C. and process pressure of 1 Torr. The chamber holding the solid dicyclooctatetraenetitanium is evacuated to the same 1 Torr pressure as the reactor, and heated to a temperature of 200° C., causing the dicyclooctatetraenetitanium to sublime. The gas product is fed through a tube to the deposition reactor. Within the reactor, the gaseous dicyclooctatetraenetitanium decomposes, depositing elemental titanium atop the surface of the semiconductor wafer. Gaseous cyclooctatetraene is also formed, having all atoms in a closed shell, non-ionic configuration, and is substantially expelled from the deposition reactor.

EXAMPLE 4

The steps of Example 1 are conducted, with the added step of feeding $SiH_4$ gas to the reactor during the same step in which the gaseous compound 1a is fed to the reactor. The $SiH_4$ gas provides a silicon atom source which combines with dissociated titanium atoms to deposit a layer of $TiSi_2$ on the wafer.

EXAMPLE 5

The steps of Example are conducted, with the added step of feeding $NH_3$ gas to the reactor during the same step in which the gaseous compound 1a is fed to the reactor. The $NH_3$ gas provides a nitrogen atom source which combines with dissociated titanium atoms to deposit a layer of TiN on the wafer.

EXAMPLE 6

A wafer is placed within a chemical vapor deposition reactor. The reactor is provided with a quartz window which is transparent to ultraviolet light. An ultraviolet light source of wavelength less than 300 nm and wattage greater than 200 watts is provided. Solid compound 2a is placed within a separate chamber adjacent to reactor. The reactor is evacuated and brought to a process temperature of 200° C. and a process pressure of 1 Torr. The chamber holding the solid compound 2a is evacuated to the same 1 Torr pressure as the reactor, and heated to a temperature of 200° C., causing compound 2a to sublime. The gas product is fed through a tube to the deposition reactor. Ultraviolet light is fed through the quartz window to within the reactor. Within the reactor, the compound 2a decomposes, depositing elemental silicon atop the surface of the semiconductor wafer.

In compliance with the statute, the invention has been described in language more or less specific as to structural and methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of chemical vapor depositing a layer on a semiconductor wafer comprising:
   positioning a semiconductor wafer within a chemical vapor deposition reactor;
   providing an organometallic reductive elimination precursor source in a non-gaseous form, the non-gaseous organometallic precursor compound containing at least two ligands bonded to a linking atom;
   subjecting the non-gaseous organometallic reductive elimination precursor to temperature and pressure conditions which vaporize the non-gaseous organometallic reductive elimination precursor into a source gas, and providing the source gas into the chemical vapor deposition reactor having the semiconductor wafer positioned therein;
   subjecting the source gas to reactive conditions within the reactor effective to impart a reductive elimination reaction of the precursor which reduces the linking atom from the precursor and which oxidizes the ligands to generate gaseous molecules having all atoms in a non-radical closed shell, non-ionic configuration, with the gaseous molecules being expelled from the reactor; and
   depositing a layer on the wafer, the layer comprising the reduced linking atom.

2. The method of chemical vapor depositing a layer of claim 1 wherein the deposited layer is comprised predominately of elemental linking atom, an alloy of the linking atom or a linking atom containing compound, or a mixture thereof.

3. The method of chemical vapor depositing a layer of claim 1 wherein the linking atom is silicon, and the deposited layer is comprised predominately of elemental silicon or a silicon containing compound, or a mixture thereof.

4. The method of chemical vapor depositing a layer of claim 1 wherein the linking atom is titanium, and the deposited layer is comprised predominately of elemental titanium, a titanium alloy or a titanium containing compound, or a mixture thereof.

5. The method of chemical vapor depositing a layer of claim 1 wherein the number of ligands consists of two, the two ligands being identical to one another.

6. The method of chemical vapor depositing a layer of claim 1 further comprising providing a reactive gas into the reactor with the source gas, the reactive gas reacting with the linking atom to form a linking atom compound incorporating at least one element of the reactive gas, the linking atom compound being deposited on the wafer, the deposited layer predominately comprising the linking atom compound.

7. The method of chemical vapor depositing a layer of claim 1 wherein the layer deposited on the wafer is predominately comprised of the linking atom in elemental form.

8. A method of chemical vapor depositing a layer on a semiconductor wafer comprising:
   positioning a semiconductor wafer within a chemical vapor deposition reactor;
   providing an organometallic precursor compound source in a non-gaseous form, the non-gaseous organometallic precursor compound containing at least two ligands bonded to a linking atom, at least one of the ligands being a chelating ligand that forms a ring containing three or five ring atoms which includes the organometallic linking atom, the chelating ligand containing a double bond in a position opposite the linking atom;
   subjecting the non-gaseous organometallic precursor compound to temperature and pressure conditions which vaporize the non-gaseous organometallic precursor compound into a source gas, and providing the source gas into the chemical vapor deposition reactor having the semiconductor wafer positioned therein;
   subjecting the source gas to a temperature of at least about 225° C. and a pressure of less than or equal to about 30 Torr within the reactor to impart a reductive elimination reaction of the precursor which reduces the linking atom from the precursor compound and which oxidizes the ligands to generate gaseous molecules having all atoms in a non-radical closed shell, non-ionic configuration, with the gaseous molecules being expelled from the reactor; and
   depositing a layer on the wafer, the layer comprising the reduced linking atom.

9. The method of chemical vapor depositing a layer of claim 8 wherein the deposited layer is comprised predominately of elemental linking atom, an alloy of the linking atom or a linking atom containing compound, or a mixture thereof.

10. The method of chemical vapor depositing a layer of claim 8 wherein the linking atom is silicon, and the deposited layer is comprised predominately of elemental silicon or a silicon containing compound, or a mixture thereof.

11. The method of chemical vapor depositing a layer of claim 8 wherein the linking atom is titanium, and the deposited layer is comprised predominately of elemental titanium, a titanium alloy or a titanium containing compound, or a mixture thereof.

12. The method of chemical vapor depositing a layer of claim 8 wherein the number of ligands consists of two, the two ligands being identical to one another.

13. The method of chemical vapor depositing a layer of claim 8 further comprising providing a reactive gas into the reactor with the source gas, the reactive gas reacting with the linking atom to form a linking atom compound incorporating at least one element of the reactive gas, the linking atom compound being deposited on the wafer, the deposited layer predominately comprising the linking atom compound.

14. The method of chemical vapor depositing a layer of claim 8 wherein the layer deposited on the wafer is predominately comprised of the linking atom in elemental form.

15. A method of chemical vapor depositing a layer on a semiconductor wafer comprising:
positioning a semiconductor wafer within a chemical vapor deposition reactor;
providing an organometallic precursor compound source in a non-gaseous form, the non-gaseous organometallic precursor compound containing at least two ligands bonded to a linking atom, at least one of the ligands being a chelating ligand that forms a ring containing three or five ring atoms which includes the organometallic linking atom, the chelating ligand containing a double bond in a position opposite the linking atom;
subjecting the non-gaseous organometallic precursor compound to temperature and pressure conditions which vaporize the non-gaseous organometallic precursor compound into a source gas, and providing the source gas into the chemical vapor deposition reactor having the semiconductor wafer positioned therein;
subjecting the source gas to a temperature of at least about 150° C., a pressure of less than or equal to about 30 Torr, and a non-thermal energy source in addition to or in substitution of a thermal energy source within the reactor to impart a reductive elimination reaction of the precursor which reduces the linking atom from the precursor compound and which oxidizes the ligands to generate gaseous molecules having all atoms in a non-radical closed shell, non-ionic configuration, with the gaseous molecules being expelled from the reactor; and
depositing a layer on the wafer, the layer comprising the reduced linking atom.

16. The method of chemical vapor depositing a layer of claim 15 wherein the non-thermal energy source comprises ultraviolet light.

17. The method of chemical vapor depositing a layer of claim 15 wherein the deposited layer is comprised predominately of elemental linking atom, an alloy of the linking atom or a linking atom containing compound, or a mixture thereof.

18. The method of chemical vapor depositing a layer of claim 15 wherein the linking atom is silicon, and the deposited layer is comprised predominately of elemental silicon or a silicon containing compound, or a mixture thereof.

19. The method of chemical vapor depositing a layer of claim 15 wherein the linking atom is titanium, and the deposited layer is comprised predominately of elemental titanium, a titanium alloy or a titanium containing compound, or a mixture thereof.

20. The method of chemical vapor depositing a layer of claim 15 wherein the number of ligands consists of two, the two ligands being identical to one another.

21. The method of chemical vapor depositing a layer of claim 15 further comprising providing a reactive gas into the reactor with the source gas, the reactive gas reacting with the linking atom to form a linking atom compound incorporating at least one element of the reactive gas, the linking atom compound being deposited on the wafer, the deposited layer predominately comprising the linking atom compound.

22. The method of chemical vapor depositing a layer of claim 15 wherein the layer deposited on the wafer is predominately comprised of the linking atom in elemental form.

23. A method of chemical vapor depositing a layer on a semiconductor wafer comprising:
positioning a semiconductor wafer within a chemical vapor deposition reactor;
providing an organometallic precursor compound source in a non-gaseous form, the non-gaseous organometallic precursor compound containing at least two ligands bonded to a linking atom, at least one of the ligands being cyclooctatetraene or a derivative thereof;
subjecting the non-gaseous organometallic precursor compound to temperature and pressure conditions which vaporize the non-gaseous organometallic precursor compound into a source gas, and providing the source gas into the chemical vapor deposition reactor having the semiconductor wafer positioned therein;
subjecting the source gas to a temperature of at least about 225° C. and a pressure of less than or equal to about 30 Torr within the reactor to impart a reductive elimination reaction of the precursor which reduces the linking atom from the precursor compound and which oxidizes the ligands to generate gaseous molecules having all atoms in a non-radical closed shell, non-ionic configuration, with the gaseous molecules being expelled from the reactor; and
depositing a layer on the wafer, the layer comprising the reduced linking atom.

24. The method of chemical vapor depositing a layer of claim 23 wherein the deposited layer is comprised predominately of elemental linking atom, an alloy of the linking atom or a linking atom containing compound, or a mixture thereof.

25. The method of chemical vapor depositing a layer of claim 23 wherein the linking atom is silicon, and the deposited layer is comprised predominately of elemental silicon or a silicon containing compound, or a mixture thereof.

26. The method of chemical vapor depositing a layer of claim 23 wherein the number of ligands consists of two, the two ligands being identical to one another.

27. The method of chemical vapor depositing a layer of claim 23 wherein the linking atom is titanium, and the deposited layer is comprised predominately of elemental titanium, a titanium alloy or a titanium containing compound, or a mixture thereof.

28. A method of chemical vapor depositing a layer on a semiconductor wafer comprising:
positioning a semiconductor wafer within a chemical vapor deposition reactor;
providing an organometallic precursor compound source in a non-gaseous form, the non-gaseous organometallic precursor compound containing at least two ligands bonded to a linking atom, at least one of the ligands being cyclooctatetraene or a derivative thereof;
subjecting the non-gaseous organometallic precursor compound to temperature and pressure conditions which vaporize the non-gaseous organometallic precursor compound into a source gas, and providing the source gas into the chemical vapor deposition reactor having the semiconductor wafer positioned therein;

subjecting the source gas to a temperature of at least about 150° C., a pressure of less than or equal to about 30 Torr, and a non-thermal energy source in addition to or in substitution of a thermal energy source within the reactor to impart a reductive elimination reaction of the precursor which reduces the linking atom from the precursor compound and which oxidizes the ligands to generate gaseous molecules having all atoms in a non-radical closed shell, non-ionic configuration, with the gaseous molecules being expelled from the reactor; and depositing a layer on the wafer, the layer comprising the reduced linking atom.

29. The method of chemical vapor depositing a layer of claim 28 wherein the non-thermal energy source comprises ultraviolet light.

30. The method of chemical vapor depositing a layer of claim 28 wherein the deposited layer is comprised predominately of elemental linking atom, an alloy of the linking atom or a linking atom containing compound, or a mixture thereof.

31. The method of chemical vapor depositing a layer of claim 28 wherein the linking atom is silicon, and the deposited layer is comprised predominately of elemental silicon or a silicon containing compound, or a mixture thereof.

32. The method of chemical vapor depositing a layer of claim 28 wherein the number of ligands consists of two, the two ligands being identical to one another.

33. The method of chemical vapor depositing a layer of claim 28 wherein the linking atom is titanium, and the deposited layer is comprised predominately of elemental titanium, a titanium alloy or a titanium containing compound, or a mixture thereof.

* * * * *